United States Patent
Takahashi (10) Patent No.: US 7,573,079 B2
(45) Date of Patent: Aug. 11, 2009

(54) FIELD EFFECT TYPE SEMICONDUCTOR DEVICE

(75) Inventor: Tsuyoshi Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/041,979

(22) Filed: Jan. 26, 2005

(65) Prior Publication Data

US 2006/0049427 A1 Mar. 9, 2006

(30) Foreign Application Priority Data

Sep. 7, 2004 (JP) ............................. 2004-259950

(51) Int. Cl.
*H01L 29/739* (2006.01)
(52) U.S. Cl. ................. 257/194; 257/192; 257/E21.401
(58) Field of Classification Search ......... 257/189–196, 257/12, E29.246–E29.249, 252, E21.401
See application file for complete search history.

(56) References Cited

U.S. PATENT DOCUMENTS

| | | | | |
|---|---|---|---|---|
| 5,021,857 A | * | 6/1991 | Suehiro | 257/392 |
| 5,151,757 A | * | 9/1992 | Enoki et al. | 257/194 |
| 5,508,535 A | * | 4/1996 | Nakanishi | 257/192 |
| 5,569,953 A | * | 10/1996 | Kikkawa et al. | 257/607 |
| 5,686,741 A | * | 11/1997 | Ohori et al. | 257/192 |
| 6,919,589 B2 | * | 7/2005 | Noda | 257/190 |
| 7,183,592 B2 | * | 2/2007 | Hwang | 257/194 |
| 2005/0263789 A1 | * | 12/2005 | Hwang | 257/194 |

FOREIGN PATENT DOCUMENTS

| | | |
|---|---|---|
| EP | 0 367 411 A2 | 5/1990 |
| JP | 62-190772 | 8/1987 |
| JP | 2-102545 | 4/1990 |
| JP | 10-32176 | 2/1998 |
| JP | 10-209434 | 8/1998 |
| JP | 11-177079 | 7/1999 |
| JP | 2003-23016 | 1/2003 |
| JP | 2004-511913 | 4/2004 |
| JP | 2004186465 A * | 7/2004 |

OTHER PUBLICATIONS

Japanese Office Action with English translation dated May 20, 2008.
Japanese Office Action with English Translation dated Sep. 30, 2008.

* cited by examiner

*Primary Examiner*—Thinh T Nguyen
(74) *Attorney, Agent, or Firm*—Kratz, Quintos & Hanson, LLP (57) ABSTRACT

A field effect type semiconductor device is disclosed wherein a channel is easily depleted just under a gate electrode to implement an E-mode, but a channel is hard to be depleted just under a gate recess region so that the transconductance gm and the cutoff frequency $f_T$ can be set to sufficiently high values. The present device includes a first etching stop layer Schottky contacting with an end face of the gate electrode and a second etching stop layer extending to a position in the proximity of a side face of the gate electrode. The first etching stop layer is formed from a material which is easily depleted (one of materials of a group including InAlP, InP, InAsP, InSbP, InAlAsP, and InAlSbP), and the second etching stop layer is formed from a material which is hard to be depleted (one of materials of a group including InGaP, InGaAsP, InGaSbP).

5 Claims, 7 Drawing Sheets

FIELD EFFECT TYPE SEMICONDUCTOR DEVICE

CROSS REFERENCE TO RELATED APPLICATIONS

This application is based on and hereby claims priority to Japanese Application No. 2004-259950 filed on Sep. 7, 2004 in Japan, the contents of which are hereby incorporated by reference.

BACKGROUND OF THE INVENTION

1. Field of the Invention

The present invention relates to a field effect type semiconductor device, and more particularly to a field effect type semiconductor device suitable for use with a field effect type device such as, for example, an HEMT (High Electron Mobility Transistor), an MESFET (Metal Semiconductor Field Effect Transistor) and so forth formed from compound semiconductor such as an InP material.

2. Description of the Related Art

In recent years, an HEMT is applied to signal processing circuits of optical communication systems, high speed digital circuits and so forth because it has a superior high-speed characteristic. Since the HEMT particularly has a superior low-noise characteristic, it is expected to be applied also to an amplifier for a microwave or millimeter wave band.

Meanwhile, in order to allow a digital circuit to operate at a high speed, it is demanded to raise the value of transconductance (gm) which is a device parameter relating to an amplification coefficient of a device and the value of a cutoff frequency ($f_T$) of a current gain which is an upper limit to the frequency of amplification operation regarding a current gain of a transistor.

For example, as a transistor capable of operating at a high speed, an HEMT (InP-HEMT) formed using an InP related material can be listed. However, if the circuit scale increases, then reduction of the chip area and suppression of power consumption are required.

Generally, the HEMT operates in a depletion mode (D-mode). Therefore, electric current continues to flow also in a standby state, and it is difficult to achieve low power consumption operation.

Therefore, in order to allow an HEMT to operate at a high speed with lower consumption power, it is necessary to implement an InP-HEMT which can operate in an enhancement mode (E-mode) or an InP-HEMT of the E-mode/D-mode complementary type.

For example, Japanese Patent Laid-Open No. 10-209434 discloses a transistor wherein the E-mode and the D-mode are formed separately from each other depending upon whether or not an etching stopper layer is formed just under the gate electrode. The etching stopper layer is formed from InP.

Published Japanese Translation of a PCT Application, No. 2004-511913 discloses an HEMT wherein the E-mode and the D-mode are fabricated separately from each other depending upon whether or not a barrier layer (etching stop layer) is formed under the gate electrode. The barrier layer is formed from InGaP.

Japanese Patent Laid-Open No. 2003-23016 discloses a transistor device wherein the E-mode and the D-mode are fabricated separately from each other by forming two etching stop layers. Both of the etching stop layers are formed from InGaP.

SUMMARY OF THE INVENTION

However, while various techniques for implementing the E-mode in an HEMT are proposed in the techniques disclosed in the documents mentioned above, it cannot be avoided that, as a secondary effect of the implementation of the E-mode, the channel is easily placed into a depletion state and the source resistance increases. Therefore, the values of the transconductance gm and the cutoff frequency $f_T$ decrease significantly from those in the D-mode.

Figure 7:
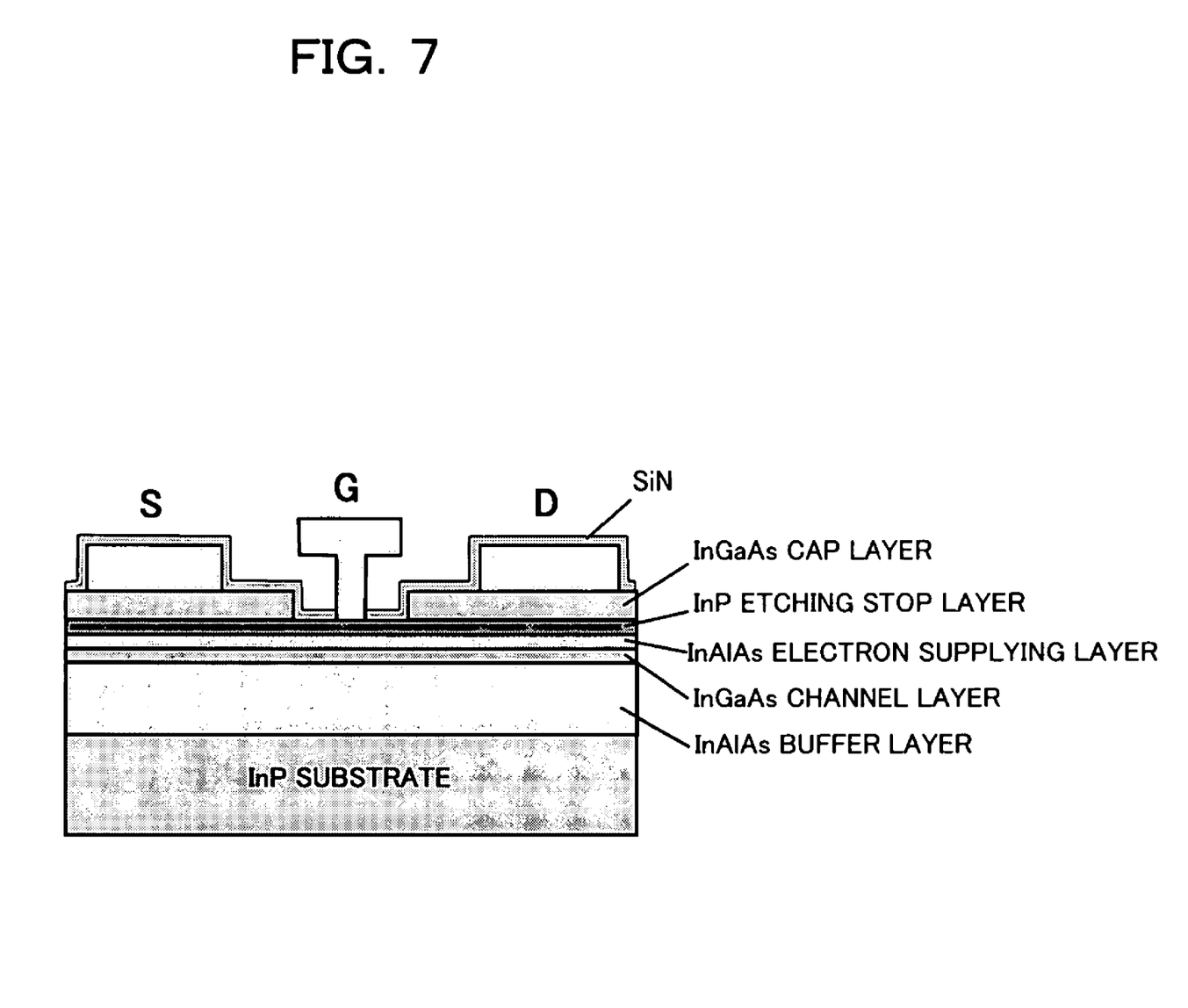
FIG. 7 is a schematic sectional view showing a configuration of a conventional InP-HEMT.

Particularly, in an InP-HEMT, in order to control a threshold voltage, InP is frequently used as an etching stop layer. For example, as shown in FIG. 7, in a gate recess region, an InP etching stop layer is exposed to the surface of the gate recess region. In such a structure as just described, if the threshold voltage is set to a positive value to implement the E-mode, then a channel formed just under the gate recess region is placed into a depletion state and the resistance increases. As a result, the values of the transconductance gm and the cutoff frequency $f_T$ decrease significantly from those in the D-mode.

It is an object of the present invention to provide a field effect type semiconductor device wherein a channel is easily depleted just under a gate electrode to implement the E-mode while a channel is hard to be depleted just under a gate recess region so that the values of the transconductance gm and the cutoff frequency $f_T$ can be set sufficiently high.

In order to attain the object described above, according to an aspect of the present invention, there is provided a field effect type semiconductor device, comprising a gate electrode, a first etching stop layer Schottky contacting with an end face of the gate electrode, and a second etching stop layer extending to a position in the proximity of a side face of the gate electrode, the first etching stop layer being formed from a material which is easy to be depleted, the second etching stop layer being formed from a material which is hard to be depleted.

Preferably, the first etching stop layer is formed from one of materials of a group including InAlP, InP, InAsP, InSbP, InAlAsP, and InAlSbP, and the second etching stop layer is formed from one of materials of a group including InGaP, InGaAsP, and InGaSbP.

Preferably, the first etching stop layer is formed on an electron supplying layer, and the electron supplying layer is formed on a channel layer.

Preferably, the electron supplying layer is formed from InAlAs or InAlAsSb, and the channel layer is formed from InGaAs, InAlGaAs, InAs, InP or a multilayer structure formed from two or more of InGaAs, InAlGaAs, InAs, and InP.

Preferably, another gate electrode Schottky contacting with the second etching stop layer is provided.

According to another aspect of the present invention, there is provided a field effect type semiconductor device, comprising an enhancement mode region including a first gate electrode, a first etching stop layer Schottky contacting with an end face of the first gate electrode, a second etching stop layer extending to a position in the proximity of a side face of the first gate electrode, and an insulation film formed on the second etching stop layer, and a depletion mode region including a second electrode, a third etching stop layer Schottky contacting with an end face of the second gate electrode, and an insulation film formed on the third etching stop layer, the first etching stop layer being formed from one of materials of a group including InAlP, InP, InAsP, InSbP, InAlAsP, and InAlSbP, the second and third etching stop layers being formed from one of materials of a group including InGaP, InGaAsP, and InGaSbP.

Preferably, the depletion mode region further includes a barrier layer provided under the third etching stop layer, and the barrier layer is formed from one of materials of a group including InAlP, InP, InAsP, InSbP, InAlAsP, and InAlSbP.

Preferably, the barrier layer and the first etching stop layer are formed on an electron supplying layer formed from δ-doped InAlAs or δ-doped InAlAsSb, and the electron supplying layer is formed on a channel layer formed from i-InGaAs, i-InAlGaAs, i-InAs, i-InP or a multilayer structure of two or more of i-InGaAs, i-InAlGaAs, i-InAs, and i-InP.

According to a further aspect of the present invention, there is provided a field effect type semiconductor device, comprising agate electrode, a first etching stop layer Schottky contacting with an end face of the gate electrode, a second etching stop layer extending to a position in the proximity of a side face of the gate electrode, and an insulation film formed on the second etching stop layer, a difference in electron affinity between the second etching stop layer and the insulation film being larger than a difference in electron affinity between the first etching stop layer and the insulation film.

Preferably, the difference in electron affinity between the first etching stop layer and the insulation film is equal to or smaller than a difference in electron affinity between InP and the insulation film.

According to a still further aspect of the present invention, there is provided a field effect type semiconductor device, comprising agate electrode, a first etching stop layer Schottky contacting with an end face of the gate electrode, a second etching stop layer extending to a position in the proximity of a side face of the gate electrode, and an insulation film formed on the second etching stop layer, a difference in electron affinity between the second etching stop layer and the insulation film being larger than a difference in electron affinity between InP and the insulation film.

Preferably, the insulation film is formed from SiN, $SiO_2$, SiON or a multilayer structure of two or more of SiN, $SiO_2$, and SiON.

Preferably, the gate electrode is configured by laminating Ti, Pt, and Au.

Accordingly, with the field effect type semiconductor device of the present invention, there is an advantage that the channel is easily depleted just under the gate electrode and the E-mode is implemented. Meanwhile, the channel is hard to be depleted just under the gate recess region and the values of the transconductance gm and the current gain cutoff frequency $f_T$ can be sufficiently increased.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

In the following, field effect type semiconductor device according to embodiments of the present invention are described with reference to the drawings.

First Embodiment

First, a configuration of a field effect type semiconductor device according to a first embodiment of the present invention is described with reference to FIGS. 1, 2(A), 2(B), 3(A) to 3(C), and 4(A) to 4(D).

If InAlP is used as a layer to Schottky contact with an end face of a gate electrode, then the E-mode can be easily implemented, but if InGaP is used as a layer to be exposed to the surface of a gate recess region, then the channel sheet resistance just under the gate recess region can be suppressed low. Therefore, in the field effect type semiconductor device according to the present embodiment, a stop layer of a two-layer structure formed from materials of InAlP and InGaP having properties different from each other is used as an etching stop layer in place of a conventional stop layer formed from InP, and a gate contacts with the stop layer formed from InAlP while the stop layer formed from InGaP is exposed to the gate recess surface.

The field effect type semiconductor device according to the present embodiment can be applied, for example, to an InP-HEMT. The InP-HEMT is particularly described below as an example.

Figure 1:
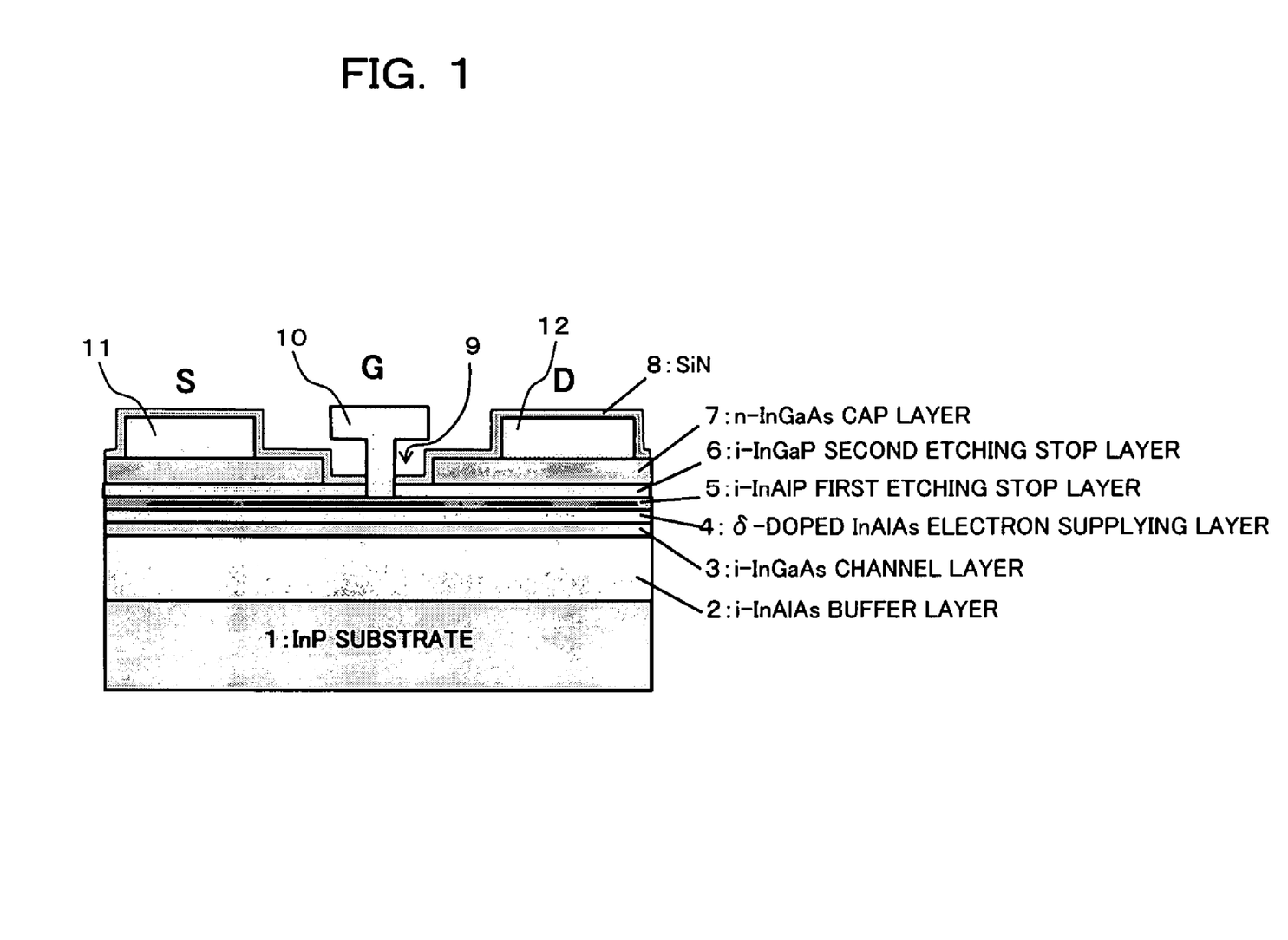
FIG. 1 is a schematic sectional view showing a configuration of a field effect type semiconductor device according to a first embodiment of the present invention.

As shown in FIG. 1, the present InP-HEMT is configured so that a buffer layer 2, a channel layer (electron transit layer, carrier transit layer) 3, an electron supplying layer (carrier supplying layer) 4, a first etching stop layer 5, a second etching stop layer 6, and a cap layer (contacting layer) 7 are laminated in order on the surface of a semi-insulating InP substrate 1. It is to be noted that layers mentioned are in a lattice matching stage with the InP substrate 1.

The buffer layer 2 is formed from undoped InAlAs (i-InAlAs). The thickness of the buffer layer 2 is 300 nm.

The channel layer 3 is formed from undoped InGaAs (i-InGaAs). It is to be noted that the channel layer 3 may otherwise be formed, for example, from InAlGaAs (i-InAlGaAs), InAs (i-InAs), InP (i-InP) or the like, or may be formed as a multilayer structure of two or more of the materials just mentioned. Here, the thickness of the channel layer 3 is 15 nm.

The electron supplying layer 4 is formed from InAlAs (δ-doped InAlAs) to which the n type conductivity is provided by δ-doping Si. It is to be noted that the electron supplying layer 4 may otherwise be formed, for example, from InAlAsSb (δ-doped InAlAsSb). Here, the thickness of the electron supplying layer 4 is 9 nm.

It is to be noted that the electron supplying layer 4 may be replaced by a lamination structure including a spacer layer formed from undoped InAlAs (i-InAlAs), a δ-doped layer (planar doped layer, electron supplying layer) formed from InAlAs (n-InAlAs) to which the n type conductivity is provided by δ-doping Si, and a barrier layer formed from undoped InAlAs (i-InAlAs).

The first etching stop layer 5 is formed from undoped InAlP (i-InAlP). The thickness of the first etching stop layer 5 is 3 nm. The first etching stop layer 5 has a function also as a barrier layer.

It is to be noted here that, while the first etching stop layer 5 is formed from InAlP, it may be formed from any material if it is easily depleted. For example, the first etching stop layer 5 may be formed from InP, or formed from InAsP, InSbP, InAlAsP, or InAlSbP formed by adding As and/or Sb to InAlP or InP. In particular, the first etching stop layer 5 may be formed from one of materials in a group including InAlP, InP, InAsP, InSbP, InAlAsP, and InAlSbP. However, since, if InAlP is used, then the band gap is expanded in comparison with that of a case wherein a material other than InAlP is used, there is an advantage that leak current can be suppressed.

The second etching stop layer 6 is formed from undoped InGaP (i-InGaP). The thickness of the second etching stop layer 6 is 3 nm. If InGaP is used, then the channel resistance (source resistance) just under the gate recess region can be decreased. As a result, there is an advantage that the values of the transconductance gm and the cutoff frequency $f_T$ can be further increased and a better high-speed characteristic can be obtained.

It is to be noted here that, while the second etching stop layer 6 is formed from InGaP, it may be formed from any material if it is hard to be depleted and, for example, formed from InGaAsP or InGaSbP formed by adding As or Sb to InGaP. In short, the second etching stop layer 6 may be formed from one of materials in a group including InGaP, InGaAsP, and InGaSbP.

In this manner, while, in the present embodiment, the etching stop layers are formed from phosphide related materials such as InGaP, InAlP and so forth, this is because an etching stopping action appears upon etching of a cap layer (which may contain InAlAs) formed from InGaAs and the threshold voltage can be adjusted with a high degree of accuracy.

Figure 2A:
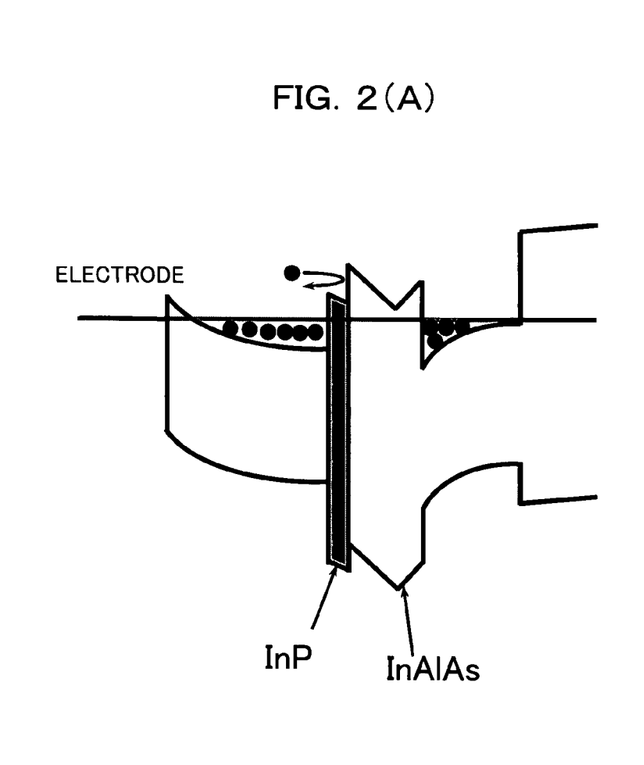
FIGS. 2(A) and 2(B) are views of energy bands illustrating the resistance between an ohmic electrode and a channel layer of the field effect type semiconductor device according to the first embodiment of the present invention.
Figure 2B:
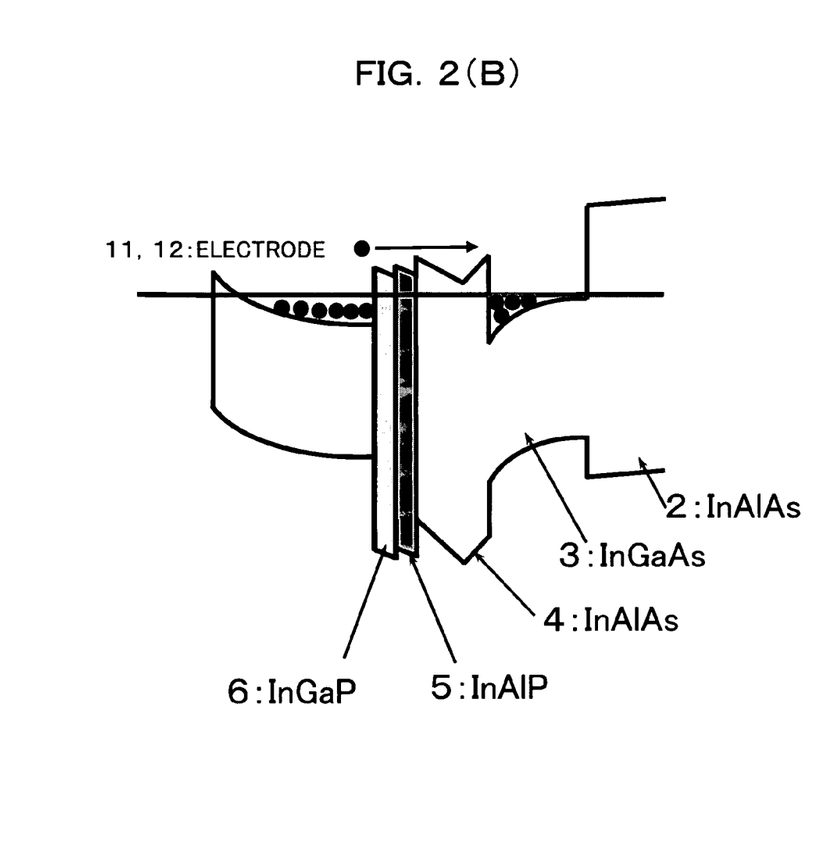

Further, if a two-layer structure including the InAlP first etching stop layer 5 and the InGaP second etching stop layer 6 is applied as described above, then the resistance (resistance between an ohmic electrode and a channel) in a perpendicular direction to the plane of a crystal layer can be suppressed low in comparison with that of a case wherein InP is used as the etching stop layers as shown in FIGS. 2(A) and 2(B). Therefore, the source resistance can be lowered. It is to be noted that FIG. 2(A) shows an energy band diagram of a common InP-HEMT wherein InP is used as the etching stop layers, and FIG. 2(B) shows an energy band diagram of the InP-HEMT according to the present embodiment.

As shown in FIG. 1, the cap layer 7 is formed from InGaAs (n-InGaAs) in which Si is doped to provide the n type conductivity thereto. The thickness of the cap layer 7 is 50 nm. It is to be noted that a two-layer structure may be formed by inserting InAlAs (n-InAlAs) in which Si is doped to provide the n type conductivity thereto under the n-InGaAs layer.

It is to be noted here that, while the second etching stop layer 6 is formed on the first etching stop layer 5, the configuration of layer is not limited to this. For example, a layer formed from a different material may be formed between the first and second etching stop layers 5 and 6.

Incidentally, in the present InP-HEMT, the gate recess 9 is formed by etching the two layers of the cap layer 7 and the second etching stop layer 6 as shown in FIG. 1.

An end face of the gate electrode 10 is in Schottky contact with a portion of a surface of the gate recess 9 (that is, a portion where the first etching stop layer 5 is exposed by removal of the second etching stop layer 6 by etching). In other words, the gate electrode 10 is formed on the first etching stop layer 5. Consequently, just under the gate electrode 10, the channel is easily depleted and the enhancement mode (E-mode) is implemented.

The gate electrode 10 is formed by laminating Ti (10 nm)/Pt (30 nm)/Au (600 nm) in order. Here, the gate electrode 10 is formed as a T-shaped gate electrode having a T-shaped cross sectional shape. It is to be noted that the shape of the gate electrode 10 is not limited to this, and, for example, it may be formed as a Y-shaped gate electrode having a Y-shaped cross sectional shape.

Meanwhile, at the other portion of the surface of the gate recess 9, the second etching stop layer 6 is exposed with the cap layer 7 removed by etching. In other words, the second etching stop layer 6 extends to a position in the proximity of a side face of the gate electrode 10 (here, it contacts with the side face of the gate electrode 10). In this manner, by exposing the i-InGaP second etching stop layer 6 on the gate recess surface (the gate recess surface is formed from the i-InGaP second etching stop layer 6), the channel becomes hard to be depleted just under the gate recess region, and consequently, electrons can be easily supplied from the electron supplying layer 4 to the channel layer 3 as seen in FIG. 1. Consequently, the channel resistance (source resistance) can be lowered, and as a result, the values of the transconductance gm and the cutoff frequency $f_T$ can be set to sufficiently high values.

Figure 3A:
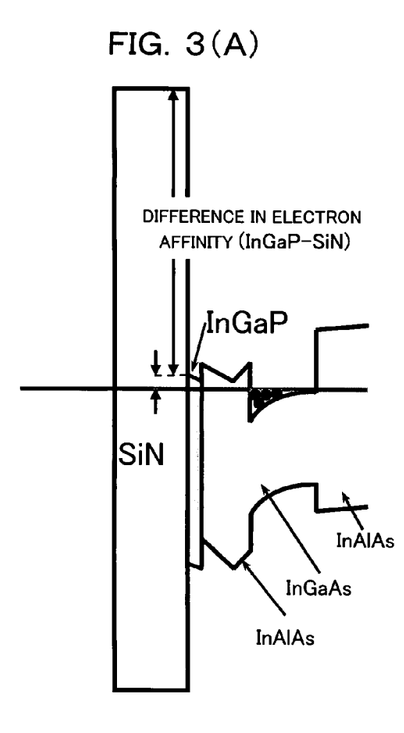
FIGS. 3(A) to 3(C) are views of energy bands illustrating a difference in electron affinity in the field effect type semiconductor device according to the first embodiment of the present invention.
Figure 3B:
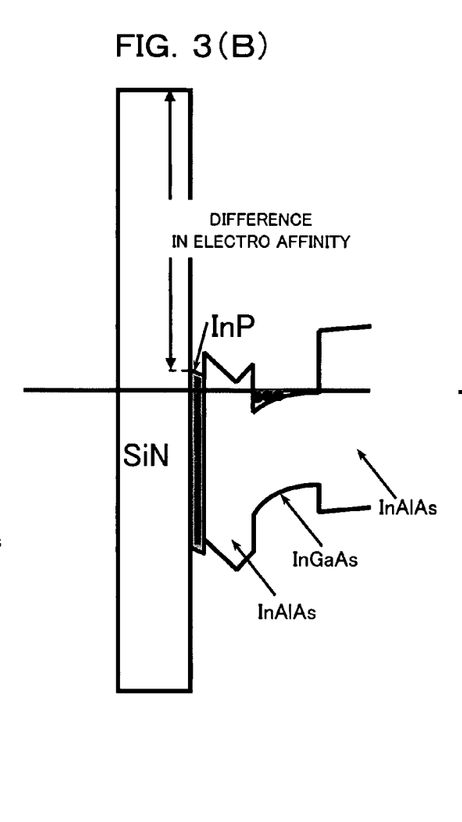

In particular, if the difference in electron affinity between InGaP (second etching stop layer 6) and SiN (insulation film 8) is greater than the difference in electron affinity between InP and SiN (insulation film 8) as shown in FIGS. 3(A) and 3(B), then electrons can be easily supplied from the electron supplying layer 4 to the channel layer 3. As a result, the channel resistance can be lowered and the values of the transconductance gm and the cutoff frequency $f_T$ can be sufficiently increased.

Figure 3C:
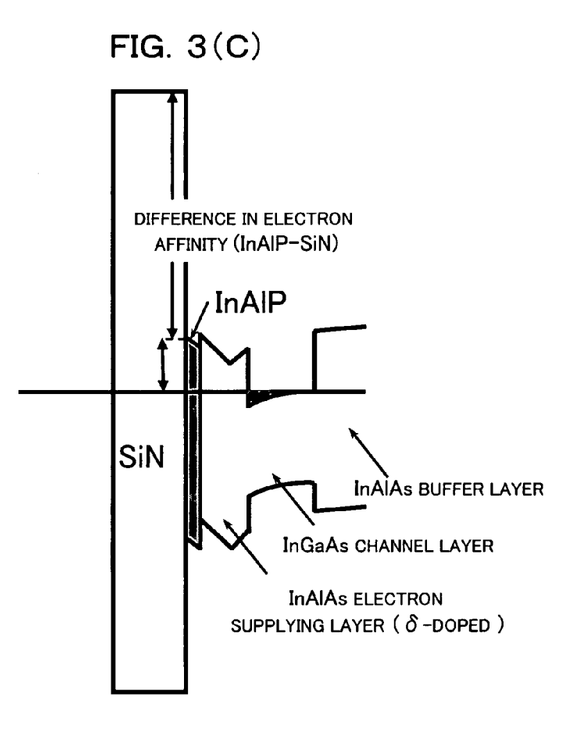

In this instance, as shown in FIGS. 3(A) and 3(C), the difference in electron affinity between InGaP (second etching stop layer 6) and SiN (insulation film 8) becomes greater than the difference in electron affinity between InAlP (first etching stop layer 5) and SiN (insulation film 8). Further, as shown in FIGS. 3(B) and 3(C), the difference in electron affinity between InAlP (fist etching stop layer 5) and SiN (insulation film 8) becomes smaller than the difference in electron affinity between InP and SiN (insulation film 8). It is to be noted that, where the first etching stop layer 5 is formed from InP, the difference in electron affinity between the first etching stop layer (InP) 5 and the insulation film (SiN) 8 becomes equal to the difference in electron affinity between InP and the insulation film (SiN) 8.

Further, a source electrode 11 and a drain electrode 12 are individually formed on the cap layer 7 positioned on the opposite sides of the gate recess 9 and forming the side faces of the gate recess 9. The electrodes 11 and 12 are formed by laminating Ti (10 nm)/Pt (30 nm)/Au (300 nm) in order. The electrodes 11 and 12 are connected in ohmic connection to the cannel layer 3 formed under them. Therefore, the electrodes are sometimes called ohmic electrodes.

Then, the surfaces of the source electrode 11, drain electrode 12, cap layer 7, and second etching stop layer 6 are covered with the insulation film 8 as a protection film. The insulation film 8 is formed from SiN. It is to be noted that the insulation film 8 may be formed, for example, from $SiO_2$, SiON or the like, or may be formed as a multilayer structure formed from the materials just mentioned. The thickness of the insulation film 8 is approximately 20 nm to 50 nm.

Now, a fabrication method of the present InP-HEMT is described with reference to FIGS. 4(A) to 4(D).

Figure 4A:
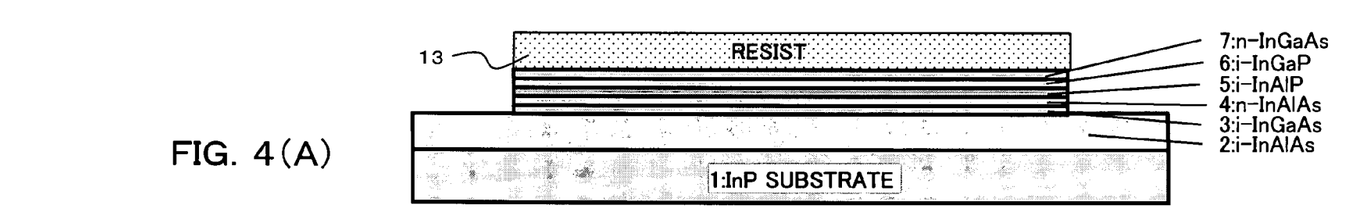
FIGS. 4(A) to 4(D) are schematic views illustrating a fabrication method of the field effect type semiconductor device according to the first embodiment of the present invention.

First, as shown in FIG. 4(A), an i-InAlAs buffer layer (thickness: 300 nm) 2, an i-InGaAs channel layer (thickness: 15 nm) 3, a planar-doped n-InAlAs electron supplying layer (impurity concentration: $1\times10^{12}$ $cm^{-2}$, thickness: 9 nm) 4, an i-InAlP first etching stop layer (thickness: 3 nm) 5, an i-InGaP second etching stop layer (thickness: 3 nm) 6, and an n-InGaAs cap layer (impurity concentration: $1\times10^{19}$ $cm^{-3}$, thickness: 50 nm) 7 are formed in order from below on an InP substrate 1 having a semi-insulation property by an MOCVD method (metal-organic chemical vapor deposition).

Then, after a resist film 13 is formed in order to define isolation region by a photolithography technique as shown in FIG. 4(A), the n-InGaAs cap layer 7 is removed by wet etching using mixture liquid of phosphoric acid, hydrogen peroxide, and water (phosphoric acid type etchant). At this time, the etching stops at the surface of the i-InGaP second etching stop layer 6. Then, the i-InGaP second etching stop layer 6 and the i-InAlP first etching stop layer 5 are selectively removed with hydrochloric acid. Then, etching is performed for the layers from the n-InAlAs electron supplying layer 4 to the i-InAlAs buffer layer 2 with phosphoric acid type etchant similarly to the n-InGaAs cap layer 7, and thereafter, the resist film 13 is removed. In this manner, isolation is performed by mesa etching.

Figure 4B:
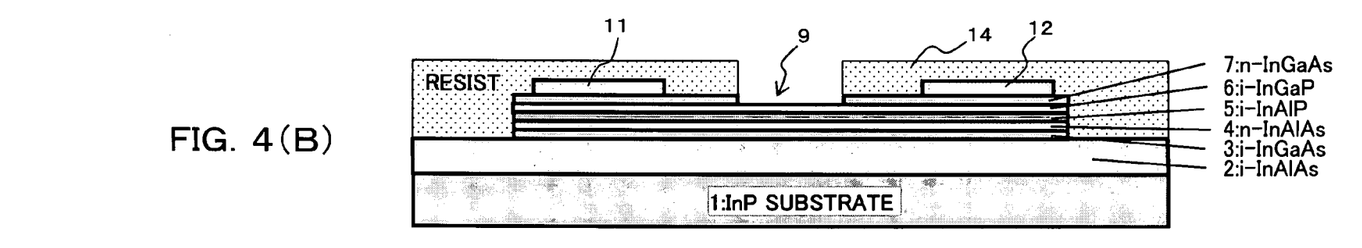

Then, a new resist film having openings corresponding to a source electrode 11 and a drain electrode 12 is formed as shown in FIG. 4(B) in order to define a source electrode region and a drain electrode region by a photolithography technique.

Then, Ti (thickness: 10 nm), Pt (thickness: 30 nm), and Au (thickness: 300 nm) are deposited in order on an overall area (for example, deposited by a vacuum evaporation method). Thereafter, the Ti/Pt/Au deposited on the resist film are removed together with the resist film (that is, by a lift-off method) to form a source electrode 11 and a drain electrode 12 having a three-layer structure of Ti/Pt/Au. Consequently, the source electrode 11 and the drain electrode 12 are formed on the n-InGaAs cap layer 7.

Thereafter, a new resist film 14 having an opening corresponding to a gate recess region is formed as shown in FIG. 4(B) in order to define a gate recess region using a photolithography technique or an electronic beam exposure method. Then, the n-InGaAs cap layer 7 is removed by wet etching using mixture solution (etchant) of citric acid, hydrogen peroxide, and water to form a gate recess 9. At this time, since the etchant scarcely etches the i-InGaP second etching stop layer 6, the etching stops at the surface of the i-InGaP second etching stop layer 6. Therefore, the i-InGaP second etching stop layer 6 is exposed on a surface of the gate recess 9.

Figure 4C:
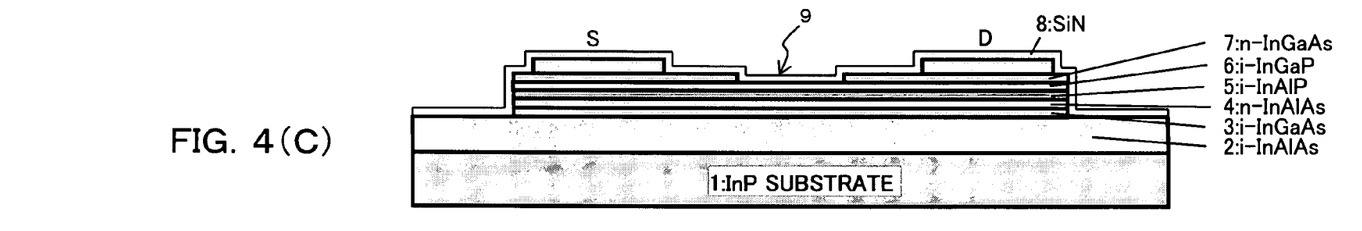

Then, the resist is removed, and an SiN insulation film 8 is formed on an overall area, for example, by a plasma CVD method such that it has the thickness of approximately 20 nm to 50 nm as shown in FIG. 4(C).

Figure 4D:
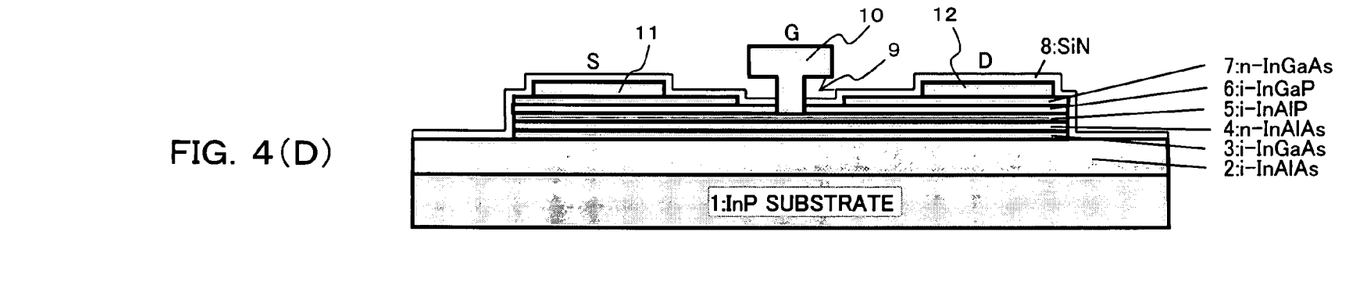

Then, a new resist film having an opening corresponding to a gate electrode 10 is formed as shown in FIG. 4(D) in order to define a gate region using a photolithography technique or an electronic beam exposure method, and then the SiN insulation film 8 and the i-InGaP second etching stop layer 6 are removed, for example, by dry etching. At this time, the etching stops at the surface of the i-InAlP first etching stop layer 5. Therefore, the i-InAlP first etching stop layer 5 is exposed on the surface of the gate recess 9.

Here, since a resist film having an opening corresponding to a gate electrode 10 is formed to perform etching, the i-InGaP second etching stop layer 6 extends to a position in the proximity of a side face of the gate electrode 10.

Then, Ti (thickness: 10 nm), Pt (thickness: 30 nm), and Au (thickness: 600 nm) are deposited in order on an overall area (for example, deposited by a vacuum evaporation method). Thereafter, the Ti/Pt/Au deposited on the resist film are removed together with the resist film (that is, by a lift-off method) to form a gate electrode 10 having a three-layer structure of Ti/Pt/Au as shown in FIG. 4(D). Consequently, the gate electrode 10 is formed on the i-InAlP first etching stop layer 5. Here, an end face of the gate electrode 10 and the i-InAlP first etching stop layer 5 are in Schottky contact with each other.

Accordingly, with the field effect type semiconductor device according to the present embodiment, since a stop layer of a two-layer structure (multi-etching stop layer) of the first etching stop layer 5 formed, for example, from InAlP and the second etching stop layer 6 formed, for example, from InGaP is used and the first etching stop layer 5 is in Schottky contact with the end face of the gate electrode 10 and the second etching stop layer 6 extends to a position in the proximity of an side face of the gate electrode 10, the channel is easily depleted just under the gate electrode 10 and the E-mode is implemented. On the other hand, the channel is hard to be depleted just under the gate recess region and the source resistance can be lowered. Therefore, there is an advantage that the values of the transconductance gm and the cutoff frequency $f_T$ can be sufficiently increased.

Consequently, an E-mode HEMT capable of operating at a high speed with low power consumption (in which a high speed characteristic is improved) can be implemented. If the E-mode HEMT is used, for example, for a signal processing circuit in an optical communication system, a high-speed digital circuit or the like, then it can contribute to reduction of power consumption and higher-speed operation of a circuit.

Second Embodiment

Next, a configuration of a field effect type semiconductor device according to a second embodiment of the present invention is described with reference to FIGS. 5 and 6(A) to 6(G).

The field effect type semiconductor device (InP-HEMT) according to the present embodiment is different from that according to the first embodiment described hereinabove in that it includes an enhancement mode (E-mode) region and a depletion mode (D-mode) region.

Figure 5:
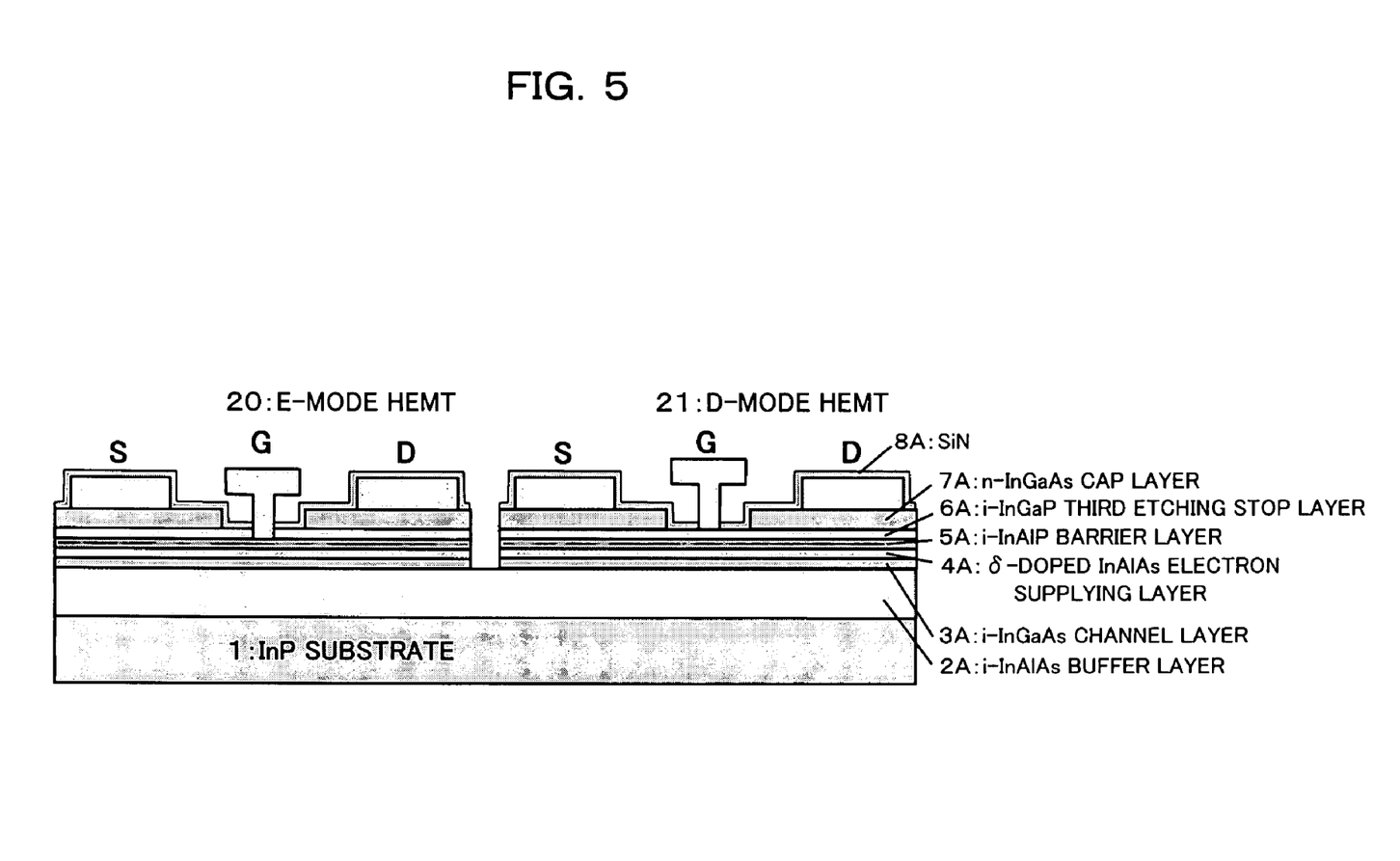
FIG. 5 is a schematic sectional view showing a configuration of a field effect type semiconductor device according to a second embodiment of the present invention.

In particular, as shown in FIG. 5, the present InP-HEMT is an E-mode/D-mode complementary HEMT wherein an enhancement mode (E-mode) region 20 and a depletion mode (D-mode) region 21 are provided on the same InP substrate 1. It is to be noted that, in FIG. 5, like elements to those of FIG. 1 are denoted by like reference characters.

Here, the enhancement mode (E-mode) region 20 is an E-mode HEMT. The configuration, fabrication method, operation and effects of the E-mode HEMT 20 are same as those of the first embodiment described hereinabove. Therefore, overlapping description thereof is omitted herein. It is to be noted that, in order to distinguish the gate electrode 10 from the gate electrode in the D-mode region, the gate electrode 10 is referred to as first gate electrode.

On the other hand, the depletion mode (D-mode) region 21 is a D-mode HEMT.

The D-mode region (D-mode HEMT) 21 is formed by laminating an i-InAlAs buffer layer 2A, an i-InGaAs channel layer (electron transit layer, carrier transit layer) 3A, a δ-doped InAlAs electron supplying layer (carrier supplying layer) 4A, an i-InAlP barrier layer 5A, an i-InGaP third etching stop layer 6A, and an n-InGaAs cap layer (contact layer) 7A in order on the surface of an InP substrate 1 having a semi-insulation property.

Here, since the E-mode HEMT 20 and the D-mode HEMT 21 are formed on the same substrate 1, also a layer configuration (crystal structure) of the D-mode HEMT 21 is similar to that of the E-mode HEMT in the first embodiment described hereinabove.

It is to be noted that, while the names of the i-InAlP barrier layer 5A and the i-InGaP third etching stop layer 6A are different from those in the first embodiment described hereinabove, the i-InAlP barrier layer 5A is same as the i-InAlP first etching stop layer 5 in the first embodiment described hereinabove, and the i-InGaP third etching stop layer 6A is same as the i-InGaP second etching stop layer 6 in the first embodiment described hereinabove.

Further, similarly as in the first embodiment described herein above, agate recess 9A is formed by etching the cap layer 7A.

An end face of the gate electrode (second gate electrode) 10A is in Schottky contact with a surface of the gate recess 9A, that is, a surface on which the i-InGaP third etching stop layer 6A is exposed by removal of the cap layer 7A by etching. In other words, the gate electrode 10A is formed on the i-InGaP third etching stop layer 6A.

Further, since the i-InGaP third etching stop layer 6A is exposed on the gate recess surface (since the gate recess surface is formed from the i-InGaP third etching stop layer 6A), the channel is hard to be depleted just under the gate recess region and electrons can be easily supplied from the electron supplying layer 4A to the channel layer 3A. As a result, the D-mode is implemented.

Further, similarly as in the first embodiment described hereinabove, a source electrode 11A and a drain electrode 12A are individually formed on the cap layer 7A positioned on the opposite sides of the gate recess 9A and forming side faces of the gate recess 9A. The electrodes 11A and 12A are formed by laminating Ti/Pt/Au in order.

The surfaces of the source electrode 11A, drain electrode 12A, cap layer 7A and third etching stop layer 6A are covered with an SiN insulation film 8A.

It is to be noted that, since the detailed configuration is same as that in the first embodiment described hereinabove, description thereof is omitted herein.

Next, a fabrication method of the InP-HEMT according to the present embodiment is described with reference to FIGS. 6(A) to 6(G).

It is to be noted that a process until a gate recess is formed is same as that in the first embodiment described hereinabove.

Figure 6:
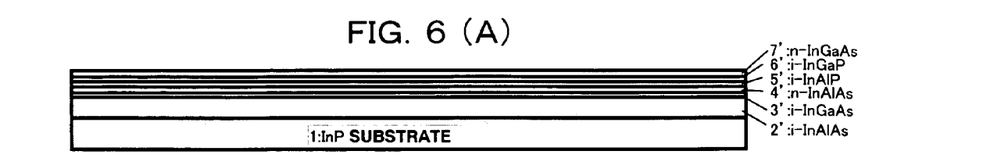
FIGS. 6(A) to 6(G) are schematic views illustrating a fabrication method of the field effect type semiconductor device according to the second embodiment of the present invention.

In particular, as shown in FIG. 6(A), similarly as in the first embodiment described hereinabove, an i-InAlAs layer 2' (buffer layer 2, 2A), an i-InGaAs layer 3' (channel layer 3, 3A), a δ-doped n-InAlAs layer 4' (electron supplying layer 4, 4A), an i-InAlP layer 5' (first etching stop layer 5 in E-mode HEMT, a barrier layer 5A in the D-mode HEMT), i-InGaP layer 6' (second etching stop layer 6 in the E-mode HEMT, a third etching stop layer 6A in the D-mode HEMT), and an n-InGaAs layer 7' (cap layer 7, 7A) are formed in order from below on an InP substrate 1 by the MOCVD method.

Thereafter, a photolithography technique is used to form a resist film in order to define a device isolation region, and then wet etching which uses an etchant of the phosphoric acid type is performed to remove the n-InGaAs layer 7'. Then, the i-InGaP layer 6' and the i-InAlP layer 5' are selectively removed with hydrochloric acid. Thereafter, the layers from the n-InAlAs layer 4' to the i-InAlAs layer 2' are etched using an etchant of the phosphoric acid type, and then the resist is removed.

By performing device isolation by mesa etching in this manner, a region 20' in which an E-mode HEMT is to be formed and another region 21' in which a D-mode HEMT is to be formed are formed divisionally. In short, in the region 20' in which an E-mode HEMT is to be formed, the lamination structure wherein the i-InAlAs buffer layer 2, i-InGaAs channel layer 3, δ-doped n-InAlAs electron supplying layer 4, i-InAlP first etching stop layer 5, i-InGaP second etching stop layer 6 and n-InGaAs cap layer 7 are laminated in order from below is formed on the InP substrate 1. On the other hand, in the region 21' in which a D-mode HEMT is to be formed, the lamination structure wherein the i-InAlAs buffer layer 2A, i-InGaAs channel layer 3A, δ-doped n-InAlAs electron supplying layer 4A, i-InAlP barrier layer 5A, i-InGaP third etching stop layer 6A and n-InGaAs cap layer 7A are laminated in order from below is formed on the InP substrate 1.

Thereafter, in order to define a source electrode region and a drain electrode region using a photolithography technique, a new resist film having openings corresponding to the source electrodes 11, 11A and the drain electrodes 12, 12A is formed. Then, Ti, Pt and Au are deposited in order on the overall area, and then the Ti/Pt/Au deposited on the resist film are removed together with the resist film (that is, by a lift-off method) to form source electrodes 11, 11A and drain electrodes 12, 12A of a three layer structure of Ti/Pt/Au. Consequently, the source electrodes 11, 11A and the drain electrodes 12, 12A are formed on the n-InGaAs cap layer 7, 7A in both of the region 20' in which an E-mode HEMT is to be formed and the region 21' in which a D-mode HEMT is to be formed, respectively, as shown in FIG. 6(C).

Then, in order to define a gate recess region using a photolithography technique or an electron beam exposure method, a new resist film having an opening corresponding to the gate recess region is formed, and then the n-InGaAs cap layer 7, 7A is removed by wet etching wherein mixture solution (etchant) of citric acid, hydrogen peroxide and water is used to form gate recesses 9, 9A in the region 20' in which an E-mode HEMT is to be formed and the region 21' in which a D-mode HEMT is to be formed, respectively, as shown in FIG. 6(D). At this time, the i-InGaP second etching stop layer 6 and the i-InGaP third etching stop layer 6A appear on the gate recess surfaces of the regions 20', 21', respectively.

Thereafter, the resist is removed, and, in order to define a gate region using a photolithography technique or an electron beam exposure method, a new resist film having an opening corresponding to the gate electrode 10A is formed in the region 21' in which a D-mode HEMT is to be formed as shown in FIG. 6(E). Then, Ti, Pt and Au are deposited in order (for example, deposited by a vacuum evaporation method) on the overall area, and then the Ti/Pt/Au deposited on the resist film are removed together with the resist film (for example, by a lift-off method) to form a gate electrode 10A of a three layer structure of Ti/Pt/Au. Consequently, the gate electrode 10A is formed on the i-InGaP third etching stop layer 6A exposed to the gate recess surface of the region 21' in which a D-mode HEMT is to be formed. Here, an end face of the gate electrode 10A and the i-InGaP third etching stop layer 6A are in Schottky contact with each other.

Then, SiN insulation film 8, 8A is formed over an overall area as shown in FIG. 6(F), for example, by a plasma CVD method. A D-mode HEMT (D-mode region) is formed thereby.

Thereafter, in order to define a gate region using a photolithography technique or an electron beam exposure method, a new resist film having an opening corresponding to a gate electrode 10 is formed in the region 20' in which an E-mode HEMT is to be formed as shown in FIG. 6(G). Then, the SiN insulation film 8 and the i-InGaP second etching stop layer 6 are removed, for example, by dry etching. At this time, the etching stops at the surface of the i-InAlP first etching stop layer 5. Therefore, the i-InAlP first etching stop layer 5 is exposed to the surface of the gate recess 9.

Here, since a resist film having an opening corresponding to the gate electrode 10 is formed to perform etching, the i-InGaP second etching stop layer 6 extends to a position in the proximity of a side face of the gate electrode 10.

Then, Ti, Pt and Au are deposited (for example, deposited by a vacuum evaporation method) in order on the overall area, and then the Ti/Pt/Au deposited on the resist film are removed together with the resist film (that is, by a lift-off method) to form a gate electrode 10 of a three layer structure of Ti/Pt/Au. Consequently, the gate electrode 10 is formed on the i-InAlP first etching stop layer 5. Here, an end face of the gate electrode 10 and the i-InAlP first etching stop layer 5 are in Schottky contact with each other. An E-mode HEMT (E-mode region) 20 is formed thereby.

Accordingly, with the field effect type semiconductor device according to the present embodiment, the E-mode HEMT 20 and the D-mode HEMT 21 can be fabricated separately from each other on the same InP substrate 1 by forming layers different from each other between the gate electrodes 10, 10A to implement an E-mode/D-mode complementary HEMT which can operate at a high speed with low power consumption (whose high speed property is improved). Where the E-mode/D-mode complementary HEMT is used in a signal processing circuit of an optical communication system, a high speed digital circuit or the like, it contributes to reduction in power consumption and increase in speed of operation of the circuit.

The present invention is not limited to the embodiments specifically described above, and variations and modifications can be made without departing from the scope of the present invention.

For example, while the embodiments described above relate to an InP-HEMT as an example of a field effect type semiconductor device, the present invention can be applied also to other field effect type semiconductor devices such as HEMTs formed using different materials and MESFETs.

What is claimed is:

1. A field effect type semiconductor device, comprising:
a gate electrode;
a first etching stop layer Schottky contacting with an end face of said gate electrode; and
a second etching stop layer formed on said first etching stop layer, contacting with a side face of said gate electrode;
said first etching stop layer being formed from InAlP;
said second etching stop layer being formed from one of materials of the group consisting of InGaP, InGaAsP, and InGaSbP;
said field effect type semiconductor device being an enhancement mode field effect type semiconductor device.

2. The field effect type semiconductor device as claimed in claim 1, further comprising an electron supplying layer and a channel layer; wherein said first etching stop layer is formed on said electron supplying layer, and said electron supplying layer is formed on said channel layer.

3. The field effect type semiconductor device as claimed in claim 2, wherein said electron supplying layer is formed from InAlAs or InAlAsSb, and said channel layer is formed from InGaAs, InAlGaAs, InAs, InP or a multilayer structure formed from two or more of InGaAs, InAlGaAs, InAs, and InP.

4. The field effect type semiconductor device as claimed in claim 1, further comprising another gate electrode Schottky contacting with said second etching stop layer.

5. The field effect type semiconductor device as claimed in claim 1, wherein said gate electrode has a T-shaped cross sectional shape or Y-shaped cross sectional shape.

* * * * *